(12) United States Patent
Zou et al.

(10) Patent No.: US 9,908,775 B2
(45) Date of Patent: Mar. 6, 2018

(54) TRANSFER METHOD, MANUFACTURING METHOD, DEVICE AND ELECTRONIC APPARATUS OF MEMS

(71) Applicant: Goertek. Inc, Shandong (CN)

(72) Inventors: Quanbo Zou, Shandong (CN); Zhe Wang, Shandong (CN)

(73) Assignee: Goertek Inc., Shandong (CN)

( * ) Notice: Subject to any disclaimer, the term of this patent is extended or adjusted under 35 U.S.C. 154(b) by 0 days.

(21) Appl. No.: 15/529,619

(22) PCT Filed: Apr. 1, 2015

(86) PCT No.: PCT/CN2015/075650
§ 371 (c)(1),
(2) Date: May 25, 2017

(87) PCT Pub. No.: WO2016/154960
PCT Pub. Date: Oct. 6, 2016

(65) Prior Publication Data
US 2017/0260045 A1    Sep. 14, 2017

(51) Int. Cl.
*B81C 1/00* (2006.01)
*H01L 25/00* (2006.01)

(52) U.S. Cl.
CPC .. *B81C 1/00896* (2013.01); *B81C 2201/0194* (2013.01); *B81C 2203/01* (2013.01); *B81C 2203/0127* (2013.01); *H01L 25/50* (2013.01); *H01L 2924/1461* (2013.01)

(58) Field of Classification Search
CPC ........ B81C 1/00896; B81C 2201/0194; B81C 2201/0191; B81C 2203/01; B81C 2203/0127; H01L 25/50; H01L 2924/1461; H05K 2201/10977; H05K 2203/0528; H05K 2203/0537; H05K 2203/107; H05K 3/321
USPC ............................................................ 438/51
See application file for complete search history.

(56) References Cited

U.S. PATENT DOCUMENTS

2009/0217517 A1*  9/2009  Pique ............... H05K 1/183
29/832
2013/0277785 A1   10/2013  Chen et al.

FOREIGN PATENT DOCUMENTS

WO    WO 2014/020390 A1    2/2014
WO    WO 2014/037829 A1    3/2014

OTHER PUBLICATIONS

International Searching Authority, International Search Report and Written Opinion for International Application No. PCT/CN2015/075650, Dec. 16, 2015, 8 pages, State Intellectual Property Office of the P.R.C., China.

(Continued)

*Primary Examiner* — Caleen Sullivan
(74) *Attorney, Agent, or Firm* — Alston & Bird LLP

(57) ABSTRACT

A transfer method, manufacturing method, device and electronic apparatus of MEMS. The method for MEMS transfer, comprising: depositing a laser-absorbing layer on a first surface of a laser-transparent carrier; forming a MEMS structure on the laser-absorbing layer; attaching the MEMS structure to a receiver; and performing a laser lift-off from the side of the carrier, to remove the carrier. A transfer of high-quality MEMS structure can be achieved in a simple, low cost manner.

18 Claims, 5 Drawing Sheets

(56) References Cited

OTHER PUBLICATIONS

Phommahaxay, Alain, et al., "Thin MEMS Packages Obtained by a Novel Collective Cap Transfer Process", *Procedia Engineering*, Proceedings of Eurosensors XXV, Sep. 4-7, 2011, Athens, Greece, pp. 1505-1508, retrieved from <http://www.sciencedirect.com/science/article/pii/S1877705811060413> on May 11, 2017.

* cited by examiner

TRANSFER METHOD, MANUFACTURING METHOD, DEVICE AND ELECTRONIC APPARATUS OF MEMS

CROSS REFERENCE TO RELATED APPLICATIONS

This application is a National Stage Application, filed under 35 U.S.C. § 371, of International Application No. PCT/CN2015/075650, filed Apr. 1, 2015; the contents of which as are hereby incorporated by reference in their entirety.

BACKGROUND

Related Field

The present invention relates to the technique of MEMS (Micro-electromechanical systems) and in particular, to a method for MEMS transfer, a method for manufacturing a MEMS device, a MEMS device and an electronic apparatus containing the MEMS device.

Description of the Related Art

MEMS is a technique which has been attracting the attentions of experts in the relevant industry. It has an extensive application. For example, the sensor in the smart phone is an example of the MEMS applications.

In the process of making a MEMS device, generally, a MEMS structure is firstly formed on the carrier wafer, the MEMS structure is then transferred to the encapsulation substrate, and finally the carrier wafer is removed. In order to be able to remove the carrier wafer easily, a temporary bonding approach is employed in the prior art for the bonding between the carrier wafer and the MEMS structure.

For example, a method of transferring MEMS structure by using thermoplastic glue is described in Alain Phommahaxay, LieveBogaerts, et al, "Thin MEMS packages obtained by a novel collective cap transfer process", Proc. Eurosensors XXV, Sep. 4-7, 2011, Athens, Greece. This document is hereby fully incorporated as reference herein. Generally, the transfer suing thermoplastic glue only allows for low-temperature process, such as 200° C.-250° C.

For example, a method for forming an electrical structure is disclosed in the PCT patent application publication No. WO 2014/037829. In this patent application, a temporary bonding is employed between the carrier wafer and the device wafer, in which the process temperature is below 400° C., for example. This patent application is hereby fully incorporated as reference herein.

For example, a method of processing a thin Si wafer bonding on a glass carrier by using laser lift-off, in which the process temperature is below 400° C., for example. This document is hereby fully incorporated as reference herein.

In the prior art, since the transfer of MEMS structure is performed by using a thermoplastic glue or a temporary bonding, it is hard to directly perform a high-temperature process to the MEMS structure on the carrier. Because it is necessary for many MEMS structures such as piezoelectric layers to go through high-temperature processes, for example, firing, annealing etc., to obtain a better quality, it is difficult to transfer and encapsulate MEMS structures of high-quality at low cost.

BRIEF SUMMARY

One object of this invention is to provide a new technical solution for MEMS transfer.

According to an embodiment of the present invention, there is provided a method for MEMS transfer, comprising: depositing a laser-absorbing layer on a first surface of a laser-transparent carrier; forming a MEMS structure on the laser-absorbing layer; attaching the MEMS structure to a receiver; and performing a laser lift-off from the side of the carrier, to remove the carrier.

Preferably, the step of depositing a laser-absorbing layer on a first surface of a laser-transparent carrier further comprises: depositing the laser-absorbing layer by means of Low Pressure Chemical Vapor Deposition or Atmospheric Pressure Chemical Vapor Deposition.

Preferably, the temperature employed in the process of depositing the laser-absorbing layer is equal to or higher than 570° C.

Preferably, the material of the laser-absorbing layer includes at least one of dielectrics, metal and/or alloy, and polymer.

Preferably, the material of the laser-absorbing layer includes at least one of poly-silicon and metal oxide.

Preferably, the step of forming a MEMS structure on the laser-absorbing layer further comprises: processing the MEMS structure on the carrier directly.

Preferably, the processing includes at least one of firing processing, annealing processing and epitaxial material deposition.

Preferably, the temperature of the processing is equal to or higher than 420° C.

Preferably, the temperature of the processing is equal to or higher than 600° C.

Preferably, the temperature of the processing is equal to or higher than 700° C.

Preferably, the temperature of the processing is equal to or higher than 1000° C.

Preferably, the receiver is a receiving wafer, the step of performing a laser lift-off from the side of the carrier is performed at wafer-level, and the method further comprises: after removing the carrier, performing singulation of the MEMS structure on the receiving wafer.

Preferably, the receiver is an assembly substrate, the step of forming a MEMS structure on the laser-absorbing layer further comprises performing singulation of the MEMS structure, and the step of performing a laser lift-off from the side of the carrier is performed at assembly-level.

Preferably, the carrier is at least one of sapphire, SiC, glass and quartz.

Preferably, the carrier is silicon substrate, and antireflection layers are coated on both sides of the silicon substrate.

According to another embodiment of the present invention, there is provided a method for manufacturing a MEMS device, comprising transferring a MEMS structure to an encapsulation substrate by using the method for MEMS transfer according to the present invention.

According to another embodiment of the present invention, there is provided a MEMS device manufactured by using the method for manufacturing a MEMS device according to the present invention.

According to another embodiment of the present invention, there is provided an electronic apparatus including a MEMS device according to the present invention.

The inventors of the present invention have found that, in the prior art, a temporary bonding is employed for MEMS transfer. The inventors of the present invention realized that it is very hard to perform a high-temperature process to the MEMS on the carrier by means of this approach. The inventors of the present invention set forth a solution for MEMS transfer without temporary bonding. So, the task to be implemented by or the technical problem to be solved by the present invention has not been conceived or anticipated by a person skilled in the art and thus the present invention is a new solution.

In addition, it should be understood by a person skilled in the art that, although a lot of problems exist in the prior art, the solution of each embodiment or each claim could just improve in one or several aspects, and it is not necessary for it to solve all the technical problems listed in the Background of the Invention or in the prior art. It should be understood by a person skilled in the art that contents which were not mentioned in a claim should not be regarded as a limitation to said claim.

Further features of the present invention and advantages thereof will become apparent from the following detailed description of exemplary embodiments according to the present invention with reference to the attached drawings.

BRIEF DESCRIPTION OF THE FIGURES

The accompanying drawings, which are incorporated in and constitute a part of the specification, illustrate embodiments of the invention and, together with the description thereof, serve to explain the principles of the invention.

DETAILED DESCRIPTION OF VARIOUS EMBODIMENTS

Figure 1:
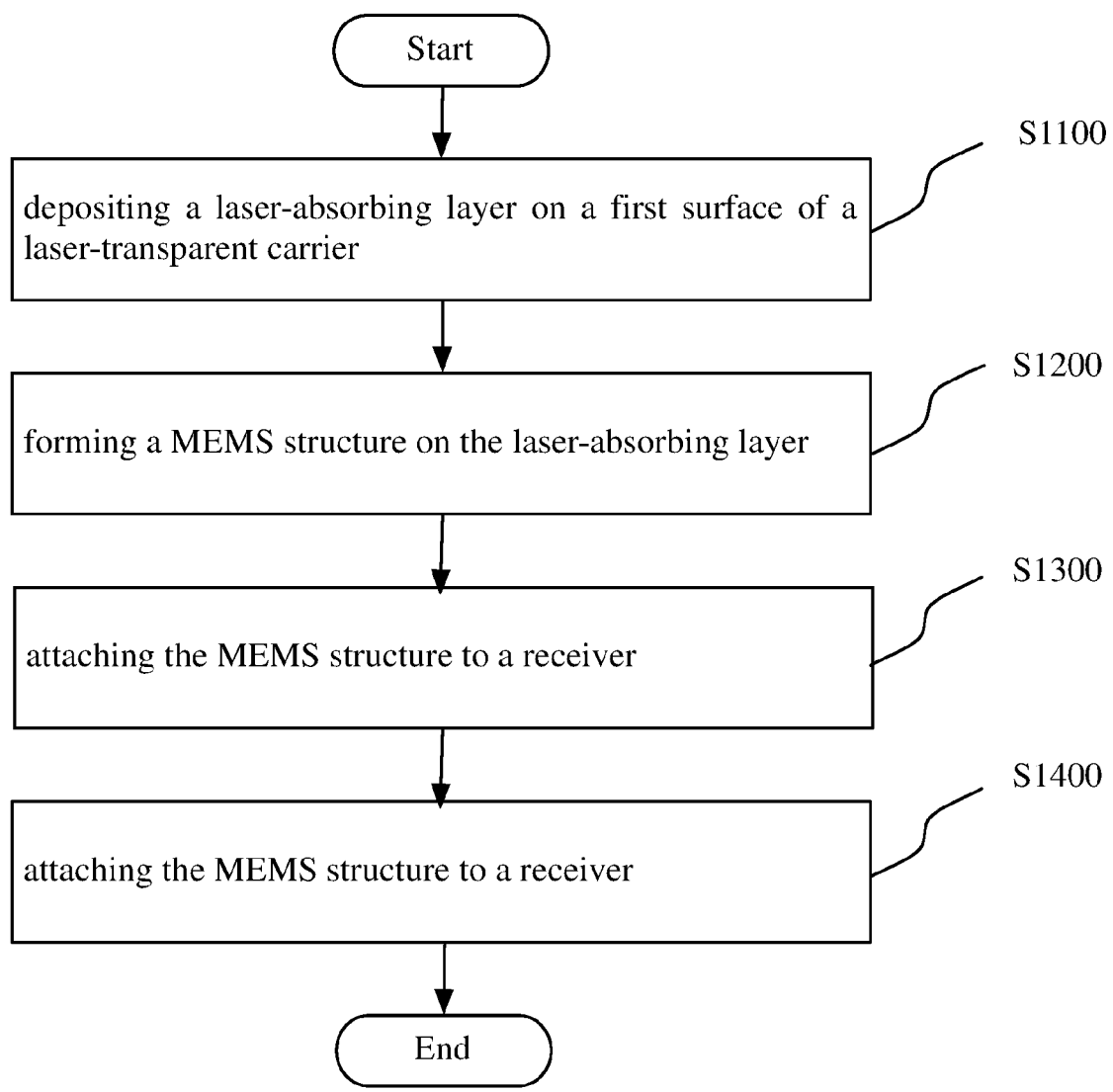
FIG. 1 shows a flow chart of an illustrative embodiment of the method according to the present invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Embodiments and examples of the present invention will be described below with reference to the drawings.

FIG. 1 shows a flow chart of an illustrative embodiment of the method for MEMS transfer according to the present invention.

As shown in FIG. 1, at step S1100, a laser-absorbing layer is deposited on a first surface of a laser-transparent carrier.

The laser-transparent carrier can be a sapphire substrate, a SiC substrate, a glass substrate or a quartz substrate, for example. Accordingly, the laser being employed can be Ultra-Violet laser, such as DUV (deep ultraviolet). For example, a common excimer laser could be employed. For example, the wavelength of the laser could be 193 nm, 248 nm or 308 nm.

Alternatively, the laser-transparent carrier can, for example, be a silicon substrate, and the laser being employed can be Infrared (IR) laser or near-Infrared (NIR) laser. Currently, in the industry of wafer manufacture, the silicon substrate is very popular and is a cost-efficient carrier. Furthermore, antireflection layers can be coated on both sides of the silicon wafer to increase the laser transmittance through the silicon substrate.

The material of the laser-absorbing layer can be at least one of dielectrics, metal and/or alloy, and polymer. For example, the material of the laser-absorbing layer is poly-silicon or metal oxide.

For example, the method of depositing the laser-absorbing layer can be Low Pressure Chemical Vapor Deposition (LPCVD). The poly-silicon can be deposited on the carrier such as sapphire or Si by means of LPCVD. The processing temperature when depositing can be equal to or higher than 570° C., for example. Alternatively, the laser-absorbing layer can be deposited by means of Atmospheric Pressure Chemical Vapor Deposition (APCVD).

In the solution of the present invention, the carrier and the MEMS structure are connected by using a general semiconductor manufacturing process, rather than the temporary bonding. In such a way, the connection between the carrier and the MEMS structure can bear higher temperature in the subsequent processes.

At step S1200, a MEMS structure is formed on the laser-absorbing layer.

For example, in the process of forming the MEMS structure, the MEMS structure can be processed on the carrier directly.

In the prior art, because a temporary bonding is employed, the highest tolerance temperature during the processing of the MEMS on the carrier is not more than 400° C. However, in the present invention, since a general semiconductor manufacturing process such as deposition is employed, the highest tolerance temperature during the processing of the MEMS on the carrier can be more than 400° C. For example, the temperature of the processing can be equal to or higher than 420° C. In another word, amongst other aspects, the present invention can be found to be different in the aspect of processing temperature for the MEMS structure on the laser-absorbing layer. It should be understood by a person skilled in the art that the temperature of processing herein means that the temperature has ever been applied on the device and does not mean that the temperature is maintained during the whole processing.

Since, compared with the prior art, a higher processing temperature can be tolerated on the carrier through the solution of the present invention, the present invention can offer, to a person skilled in the art, more diverse and more flexible approaches for processing the MEMS structures on a carrier in a low-cost and simple way. For example, the processing includes at least one of firing processing, annealing processing and epitaxial material deposition.

For example, high-temperature compatible bottom electrode deposition and patterning can be performed on the laser-absorbing layer. For example, the material of bottom electrode is Ta, TaN, W, TiW, or TiN, etc.

For example, a piezoelectric layer can be deposited over the laser-absorbing layer. For example, a firing processing can be performed to the piezoelectric layer. For example, the temperature of firing processing is equal to or higher than 600° C.; for example, preferably, is equal to or higher than 700° C.; and for example, preferably, is in the range between 700° C. and 1000° C. For example, a stacking processing can be done on the piezoelectric layer.

For example, a high-quality MEMS structure can be made directly on the carrier (or the laser-absorbing layer) by using LPCVD or APCVD. For example, deposition, doping, annealing and so on can be done directly on the carrier (the laser-absorbing layer). For example, a poly-silicon can be processed at a temperature equal to or higher than 600° C.

For example, epitaxial material deposition can be done directly on the carrier (the laser-absorbing layer). For example, the temperature during the epitaxial deposition of silicon can be equal to or higher than 1000° C.

It should be understood by a person skilled in the art that the layer-absorbing layer can be a part of the MEMS structure. For example, a part of the MEMS structure can be non-transparent and the laser can be absorbed at this part to perform a lift-off.

At step S1300, the MEMS structure is attached to a receiver.

The receiver is a receiving wafer, for example. Alternatively, the receiver is an encapsulation substrate or assembly substrate such as receiving die, for example.

At step S1400, a laser lift-off is performed from the side of the carrier, to remove the carrier. For example, a laser is irradiated from the second surface of the carrier which is opposite to the first surface, to perform a lift-off.

In an embodiment, in a case where the receiver is a receiving wafer, the laser lift-off (S1400) is performed at wafer-level; and after the laser lift-off step (S1400), singulation of the MEMS structure is performed on the receiving wafer. Its advantage lies in that the carrier can be reused, thereby further reducing the cost.

In another embodiment, in a case where the receiver is an assembly substrate such as a receiving die, singulation of the MEMS structure is performed during the step of forming a MEMS structure (S1200); and the laser lift-off is performed at assembly-level such as die-level.

For example, according to the present invention, when the MEMS structure is formed on a carrier, temporary bonding will not be employed, and a general semiconductor manufacturing process such as deposition is employed, so that a higher temperature can be tolerated in the subsequent processes. In such a way, in comparison with the prior art, the transfer of a higher quality MEMS structure can be applied into the industry in a large scale.

In another embodiment, the method for MEMS transfer according to the present invention can be used into a method for manufacturing a MEMS device. For example, in the method for manufacturing a MEMS device, the method for MEMS transfer according to the present invention is used for transferring a MEMS structure to an encapsulation substrate.

In still another embodiment, a MEMS device is manufactured by using the method for manufacturing a MEMS device according to the present invention. For example, an example of the MEMS device includes a sensor, a accelerator and so on.

A high-quality and low cost MEMS device can be implemented by using the solution of the present invention. Since processing of higher temperature can be performed directly on a carrier through the MEMS transfer method and/or manufacture method according to the present invention, the processing when forming a MEMS structure on the carrier is more flexible. Thus, under the similar conditions, compared with the prior art, the present invention can achieve a thinner MEMS device structure encapsulation.

In a further embodiment, an electronic apparatus such as mobile phone, pad computer and so on can contain a MEMS device according to the present invention.

Two examples to which the present invention can be applied will be described with reference to FIGS. 2A to 2F and FIGS. 3A to 3E.

FIGS. 2A to 2F shows an example for MEMS transfer according to the present invention.

Figure 2A:
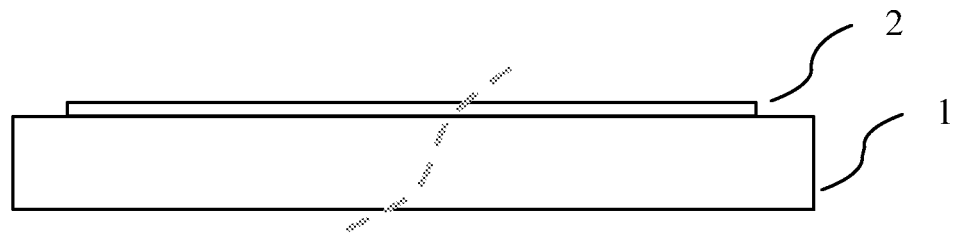
FIG. 2A to 2F shows an example for MEMS transfer according to the present invention.

In FIG. 2A, a laser-absorbing layer 2 is deposited on a carrier 1 by using LPCVD, under a temperature above 570° C. The carrier 1 can be a sapphire substrate or a silicon substrate, for example. The laser-absorbing layer 2 can be of poly-silicon, for example.

Figure 2B:
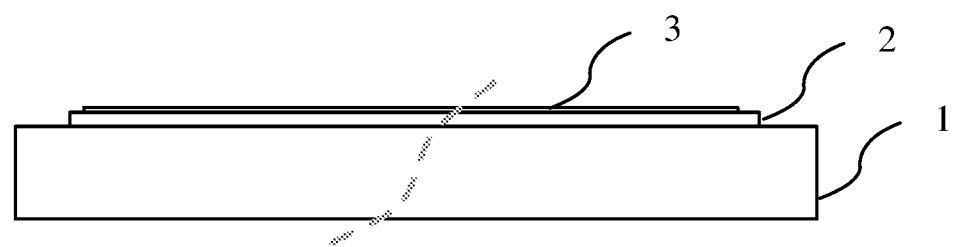

In FIG. 2B, a bottom electrode 3 is deposited on the laser-absorbing layer 2 at a high temperature and is patterned. The material of the bottom electrode 3 can be Ta, TaN, W, TiW, or TiN, etc., for example.

Figure 2C:
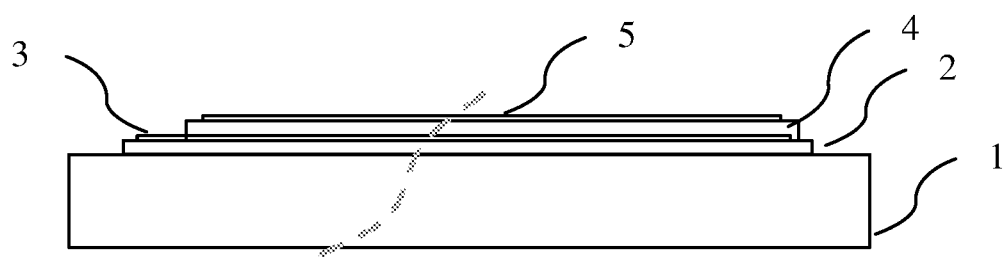

In FIG. 2C, a piezoelectric layer 4 (such as PZT material) is deposited on the bottom electrode 3, is fired at a temperature above 600° C. and is stacked. A top electrode 5 is formed on the piezoelectric layer 4, and the piezoelectric layer 4 and the top electrode 5 are patterned.

Figure 2D:
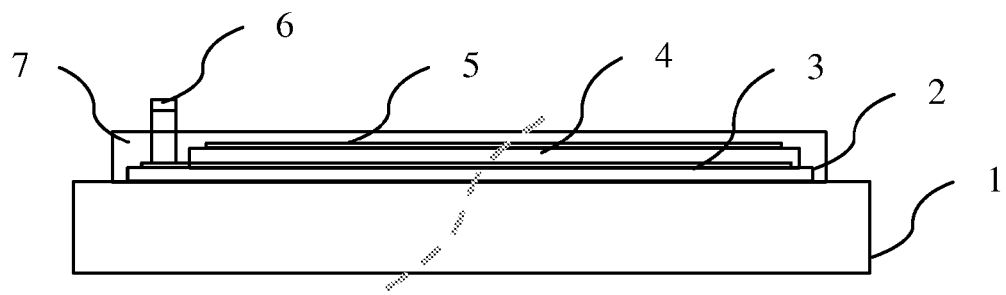

In FIG. 2D, additional processes are performed on the MEMS structure. For example, processing such as sealing, encapsulating 7 can be done to the MEMS structure. Pads or bumps 6 such as Au-stud bump or Ni/Cu pillar electroplating with Au cap can be formed in the MEMS structure, or a solder past screen printing or dispensing, etc. can be done in the MEMS structure, and so on.

Alternatively, before the MEMS structure is transferred to a receiver, the formed MEMS structure is singulated into dies on the carrier 1.

Figure 2E:
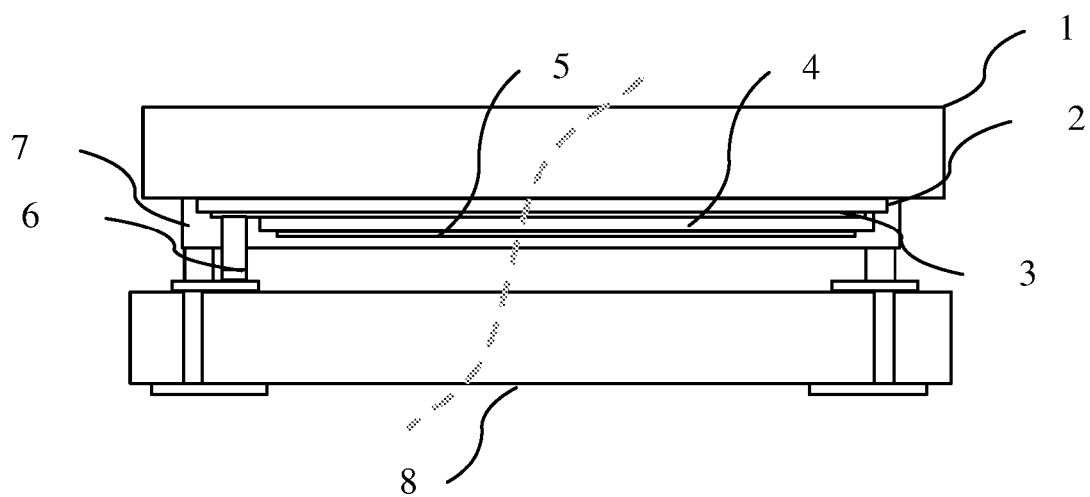

In FIG. 2E, the formed MEMS structure is attached to a receiver (encapsulation substrate) 8.

Figure 2F:
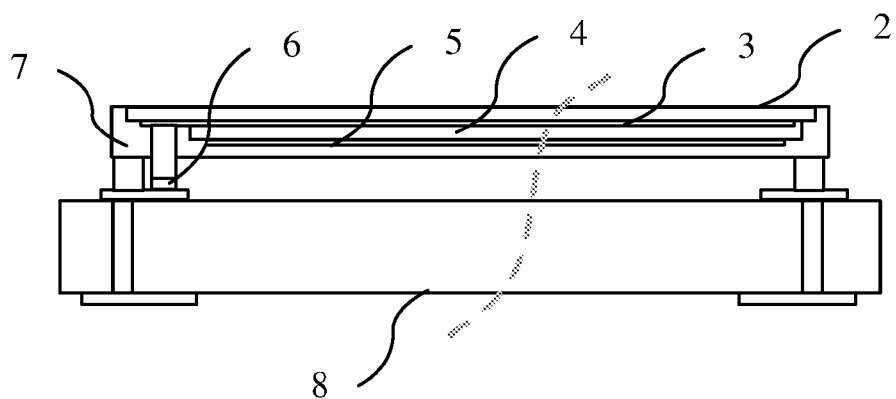

In FIG. 2F, the carrier 1 is removed from the MEMS structure by means of a laser lift-off.

For example, in the MEMS device of the example shown in FIGS. 2A to 2F, a vertical lead is set on the encapsulation substrate by using the flip-chip technology.

FIGS. 3A to 3E shows another example for MEMS transfer according to the present invention.

Figure 3A:
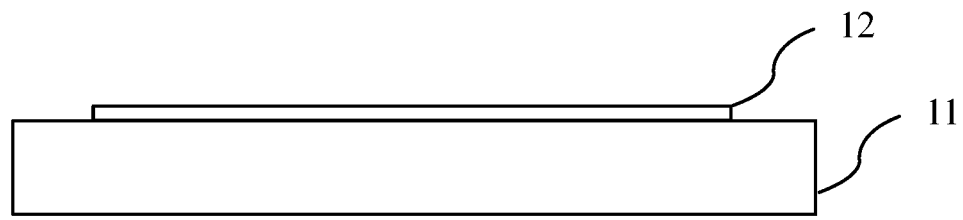
FIG. 3A to 3E shows another example for MEMS transfer according to the present invention.

In FIG. 3A, a laser-absorbing layer 12 is deposited on a carrier 11 by using LPCVD, under a temperature above 570° C. The carrier 11 can be a sapphire substrate or a silicon substrate, for example. The laser-absorbing layer 2 can be of poly-silicon, for example.

Figure 3B:
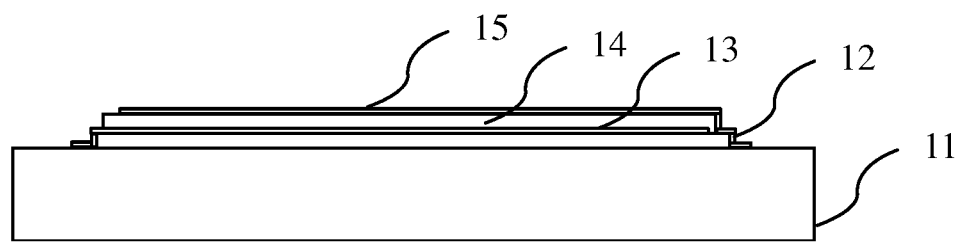

In FIG. 3B, a bottom electrode 13 is deposited on the laser-absorbing layer 12 at a high temperature and is patterned. Then, a piezoelectric layer 14 (such as PZT material) is deposited on the bottom electrode 13 and is fired at a temperature above 600° C., and the piezoelectric layer 14 is stacked and patterned. A top electrode 15 is formed on the piezoelectric layer 14, and the top electrode 15 is patterned.

Figure 3C:
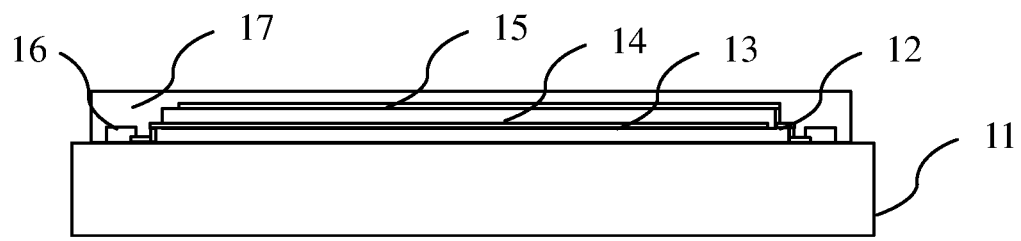

In FIG. 3C, pads 16 are formed in the MEMS structure through metal deposition/patterning or lift-off. Then, additional processes are performed on the MEMS structure. For example, processing such as sealing, encapsulating 17 can be done to the MEMS structure.

Alternatively, before the MEMS structure is transferred to a receiver, the formed MEMS structure is singulated into dies on the carrier 11.

Figure 3D:
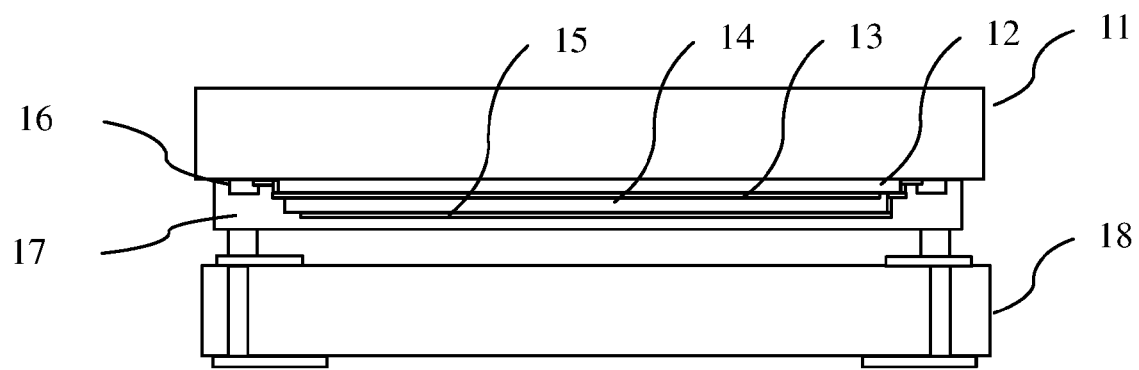

In FIG. 3D, the formed MEMS structure is attached to a receiver (encapsulation substrate) 18.

Figure 3E:
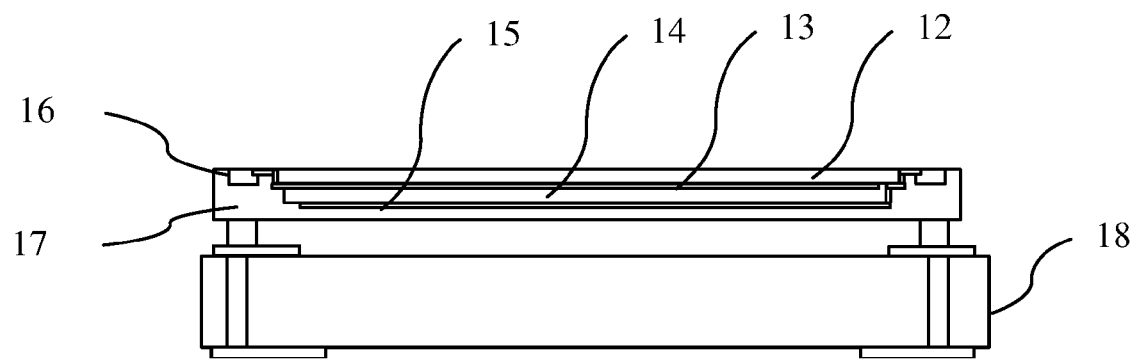

In FIG. 3E, the carrier 11 is removed from the MEMS structure by means of a laser lift-off.

For example, in the example shown in FIGS. 3A to 3E, the MEMS device is of a wire-bond encapsulation.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method for Micro-electromechanical systems (MEMS) transfer, the method comprising the steps of:
   depositing a laser-absorbing layer on a first surface of a laser-transparent carrier;
   forming a MEMS structure on the laser-absorbing layer;
   attaching the MEMS structure to a receiver; and
   performing a laser lift-off from the side of the carrier, to remove the carrier.

2. The method as recited in claim 1, wherein the step of depositing a laser-absorbing layer on a first surface of a laser-transparent carrier further comprises: depositing the laser-absorbing layer by means of Low Pressure Chemical Vapor Deposition or Atmospheric Pressure Chemical Vapor Deposition.

3. The method as recited in claim 1, wherein the temperature employed in the process of depositing the laser-absorbing layer is equal to or higher than 570° C.

4. The method as recited in claim 1, wherein the material of the laser-absorbing layer includes at least one of dielectrics, metal and/or alloy, or polymer.

5. The method as recited in claim 1, wherein the material of the laser-absorbing layer includes at least one of polysilicon or metal oxide.

6. The method as recited in claim 1, wherein the step of forming a MEMS structure on the laser-absorbing layer further comprises: processing the MEMS structure on the carrier directly.

7. The method as recited in claim 6, wherein the processing step includes at least one of firing processing, annealing processing, or epitaxial material deposition.

8. The method as recited in claim 6, wherein the temperature of the processing step is equal to or higher than 420° C.

9. The method as recited in claim 8, wherein the temperature of the processing step is equal to or higher than 600° C.

10. The method as recited in claim 9, wherein the temperature of the processing step is equal to or higher than 700° C.

11. The method as recited in claim 9, wherein the temperature of the processing step is equal to or higher than 1000° C.

12. The method as recited in claim 1, wherein:
   the receiver is a receiving wafer;
   the step of performing a laser lift-off from the side of the carrier is performed at wafer-level; and
   the method further comprises the step of, after removing the carrier, performing singulation of the MEMS structure on the receiving wafer.

13. The method as recited in claim 1, wherein:
   the receiver is an assembly substrate;
   the step of forming a MEMS structure on the laser-absorbing layer further comprises performing singulation of the MEMS structure; and
   the step of performing a laser lift-off from the side of the carrier is performed at assembly-level.

14. The method as recited in claim 1, wherein the carrier is at least one of sapphire, SiC, glass, or quartz.

15. The method as recited in claim 1, wherein:
   the carrier is silicon substrate, and
   antireflection layers are coated on both sides of the silicon substrate.

16. A method for manufacturing a MEMS device, the method comprising the step of transferring a MEMS structure to an encapsulation substrate by using the method according to claim 1.

17. A MEMS device manufactured by using the method according to claim 16.

18. An electronic apparatus including a MEMS device according to claim 17.

* * * * *